(12) United States Patent
Abe

(10) Patent No.: US 6,278,154 B1
(45) Date of Patent: *Aug. 21, 2001

(54) SEMICONDUCTOR APPARATUS AND SOLID STATE IMAGING DEVICE

(75) Inventor: Hideshi Abe, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/965,980

(22) Filed: Nov. 7, 1997

(30) Foreign Application Priority Data

Nov. 8, 1996 (JP) .................................................. 8-296938

(51) Int. Cl.[7] .................................................. H01L 29/788
(52) U.S. Cl. ..................... 257/321; 257/315; 257/316; 257/318; 257/320
(58) Field of Search ..................... 257/295–300, 257/305, 307, 315, 371, 320, 324, 321, 316, 318

(56) References Cited

U.S. PATENT DOCUMENTS

| 4,285,116 | * | 8/1981 | Meguro | 29/571 |
| 5,126,911 | * | 6/1992 | Contiero et al. | 257/306 |
| 5,237,188 | * | 8/1993 | Iwai et al. | 257/325 |
| 5,489,542 | * | 2/1996 | Iwai et al. | 257/295 |
| 5,502,321 | * | 3/1996 | Matsushita | 257/316 |
| 5,633,523 | * | 5/1997 | Kato | 257/369 |
| 5,637,187 | * | 6/1997 | Takasu et al. | 438/30 |
| 5,763,912 | * | 6/1998 | Parat et al. | 257/321 |
| 5,869,877 | * | 2/1999 | Patrick et al. | 257/321 |
| 5,953,254 | * | 9/1999 | Pourkeramati | 257/321 |

* cited by examiner

Primary Examiner—Fetsum Abraham
(74) Attorney, Agent, or Firm—Sonnenschein, Nath & Rosenthal

(57) ABSTRACT

An object of the present invention is to provide a semiconductor apparatus and a method of manufacturing the same, in which dispersion of a threshold voltage $V_{th}$ of a transistor at every transistor is reduced to remove generation of fixed charges in a gate insulation film and a surface level to stabilize the operation of the semiconductor apparatus. A semiconductor apparatus having a MIS transistor (1), wherein a gate electrode (4) of said MIS transistor (1), which mainly contributes to the operation of a circuit, is continuously formed to a position above a bypass film (8) made of an insulation film through which a leak current is able to easily flow as compared with a gate insulation film (7) of said MIS transistor (1) under the same voltage.

14 Claims, 14 Drawing Sheets

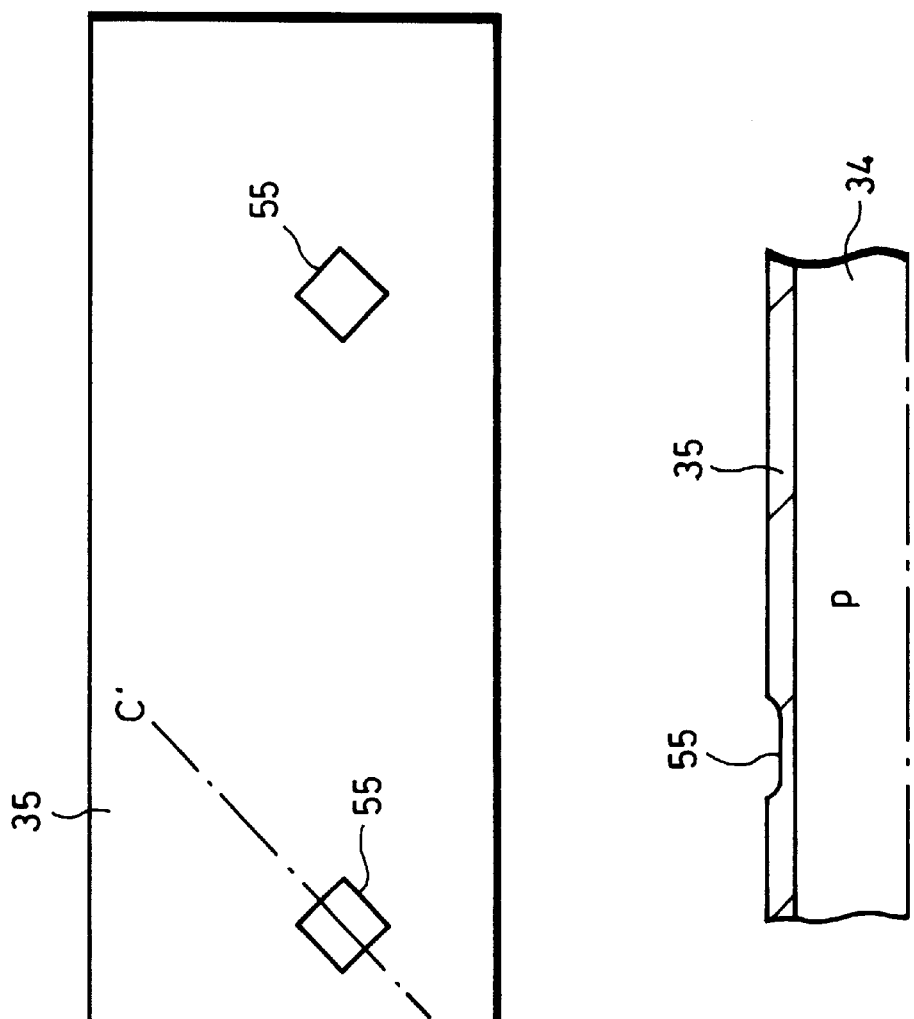

SEMICONDUCTOR APPARATUS AND SOLID STATE IMAGING DEVICE

BACKGROUND OF THE INVENTION

The present invention relates to a semiconductor apparatus having an insulated-gate type field-effect transistor, that is, a so-called MIS transistor, a manufacturing method therefor, a solid state image device having the so-called MIS transistor (hereinafter called as "MOS transistor") to serve as a pixel and a manufacturing method therefor.

When a semiconductor apparatus having, for example, a MIS transistor is manufactured, processes using plasma are employed, for example, in a plasma etching process, an ion implanting process and a process for stripping a resist or the like.

Since the size of the semiconductor element has been reduced in recent years, the MOS transistor has more critically been damaged in the plasma process. Since the processes using plasma have been increased and the density of plasma has been raised considerably, the gate electrode has been charged up. Thus, an electric current flows through a gate insulation film, thus resulting in the gate insulation film being broken in the worst case.

When the thickness of the gate insulation film is reduced because of the reduction in the size of the element, a threshold voltages $V_{th}$ of the MIS transistors are dispersed excessively by the plasma damage. It leads to a fact that the operating voltage is lowered excessively and dispersion can not be tolerated.

To reduce the foregoing plasma damage, the density of charged particles has been lowered on the side of the plasma generating apparatus.

A method of reducing the plasma damage by the element itself will now be described.

An example of the basic pattern of a MIS transistor 61 is shown in FIG. 1. The MIS transistor 61 is formed in an element-isolated active region 62 and a gate electrode 64 is formed over the active region 62 and a field region 63 formed around the active region 62. Note that the active region 62 has a source and a drain (not shown) across the gate, the source and drain being, by a contact portion 65, connected to upper wiring and so on.

To protect the MIS transistor 62 having the above-mentioned structure from being damaged during the plasma process, a method has been employed in which an area A' of the portion of the gate electrode 64 formed on the field region 63 around the active region 62 is possibly minimized as compared with an area A of the portion of the gate electrode 64 formed on the active region 62.

Since charges made incident on the gate electrode 64 are discharged to a silicon substrate through a thin portion, for example, the gate insulation film, the overall area of the gate electrode 64 which serves as an antenna is attempted to be reduced as much as possible.

However, the gate electrode is inevitably charged up because of the principle of the plasma process if plasma is used in the manufacturing process. Therefore, a tunnel current flows through a gate oxide film without exception, thus causing the potential to be raised until the leaked portion of the tunnel current and the incidental current from the plasma are balanced. Also electric currents flow undesirably.

As a result, fixed charges and surface levels are undesirably generated in the gate insulation film.

What is worse, the degree of generation of the fixed charges and the surface levels are dispersed among transistors.

If the above-mentioned phenomena arise once, heat treatment at a temperature exceeding 900° C. must be performed to solve the above defects.

The trend of finely forming the element has caused the heat treatment process to be performed at low temperatures. Thus, irregularity of the threshold voltage $V_{th}$ occurring due to the plasma damage is undesirably remained.

Also processes following the step for working the gate encounter discharge of incidental current of plasma for use in the ensuing flattening work and wiring work through the gate insulation film after the current has allowed to pass through the wiring layer made of Al or the like and the contact portion.

Moreover, discharge sometime takes place because of the difference in the potential between a polysilicon layer of the gate electrode and a resist formed on the polysilicon layer for the purpose of patterning the element.

So far as the plasma is employed to manufacturing the semiconductor apparatus, it is impossible to completely avoid the fact that the gate electrode is charged up and following leak currents flow from the gate insulation film to the substrate. As a result, dispersion of the threshold voltage $V_{th}$ of the transistor cannot easily be suppressed.

Since the level of an output signal with respect to the same input voltage is dispersed among transistors in an analog circuit or a circuit arranged to be operated at high speed comprising the MOS transistors due to the dispersion of the threshold voltage $V_{th}$, the output signal must sometimes be corrected. Since delay of transmission is not the same among the transistors, design must be performed in such a manner that large voltages and sufficiently large operating margins can be realized. Thus, the size of the element has not satisfactorily been reduced.

On the other hand, solid state image devices having MOS transistors generally involve dispersion in the threshold voltage $V_{th}$ among the transistors. Devices of a 1-transistor for 1-pixel type, for example, a CMD (Charge Modulation Device) and a BCMD (Bulk Channel Modulation Device) and a 4-transistor pixel type device called an APS (Active Pixel Sensor) encounter dispersion of the threshold voltage $V_{th}$ in an image. In order to correct the dispersion Of $V_{th}$, a large-scaled circuit system is required. However, fixed-pattern noise cannot satisfactorily be suppressed even if the large-scaled circuit system is employed.

Although uniformity of the threshold voltages $V_{th}$ among all transistors is required, fluctuation of the parameters of the manufacturing conditions and influences of various damages including the above-mentioned plasma damage cause the fixed charges and the surface levels in the gate insulation film to be varied among pixels.

To remove the above-mentioned dispersion, the amount of charges on the gate electrode during the plasma process has been reduced by employing a contrivance of the structure of the manufacturing apparatus and the layout of the device pattern. For example, the device pattern is arranged to reduce the area on which plasma ions are made incident by minimizing the area of the gate electrode of the transistor formed on the field portion similarly to the above-mentioned MIS transistor.

However, the solid state image device having a structure that one pixel is formed by one transistor suffers from dispersion in the threshold voltage $V_{th}$ being left although no gate electrode exists on the field portion. That is, employment of the above-mentioned contrivance cannot completely overcome the problem of unsatisfactory quality of the image caused from the damage by the charge of plasma.

Therefore, it has been considered that charge on the gate electrode cannot furthermore be avoided. In order to overcome the above-mentioned problem, charge on the gate electrode has been canceled by the structure of the circuit and the system. Thus, the size of the device cannot be reduced and a system for canceling the charge becomes too complicated and the scale of the system cannot be reduced. As a result, the cost of the device cannot be reduced.

SUMMARY OF THE INVENTION

In view of such aspects, it is an object of the present invention to provide a semiconductor apparatus and a manufacturing method therefore arranged such that dispersion of threshold voltages $V_{th}$ of transistors is reduced to inhibit generation of fixed charges and surface levels in a gate insulation film to stabilize the operation of the semiconductor apparatus and a solid state image device which is capable of suppressing fixed pattern noise and therefore improving the image quality and a manufacturing method therefor.

A semiconductor apparatus according to the present invention has a structure that a gate electrode of an MIS transistor is continuously formed up to a portion above a bypass film made of an insulation film through which a leak current is able to easily flow as compared with a gate insulation film of the MIS transistor when the voltage level is the same.

A method of manufacturing a semiconductor apparatus according to the present invention comprises the steps of forming a bypass film made of an insulation film through which a leak current is able to easily flow as compared with a gate insulation film of the MIS transistor and forming a gate electrode which is continued up to a portion above the bypass film; and a working process being carried out while performing destaticization through the bypass film.

A solid state image device according to the present invention comprises a bypass film made of an insulation film through which a leak current is able to easily flow as compared with a gate insulation film, the bypass film being formed between a wiring for connecting gate electrodes of MOS transistors forming a pixel to each other and a drain region.

A method of manufacturing a solid state image device according to the present invention comprises the step of forming a bypass film through which a leak current is able to easily flow as compared with a gate insulation film, the bypass film being formed in an insulation film between a wiring for connecting gate electrodes of MOS transistors forming the pixel to each other and a drain region, wherein a working process is performed while performing destaticization through the bypass film.

The semiconductor apparatus according to the present invention has the structure that the gate electrode of the MIS transistor is continuously formed up to a portion above the bypass film made of an insulation film through which a leak current is able to easily flow as compared with the gate insulation film of the MIS transistor when the voltage level is the same. Therefore, charged particles made incident on the gate electrode are caused to flow to a substrate through the bypass film. Thus, charging of the gate insulation film on the channel of the MIS transistor, which causes the characteristics of the MIS transistor to be changed, can be suppressed.

The method of manufacturing the semiconductor apparatus according to the present invention makes it possible that a work process is performed while performing destaticization through the bypass film. Therefore, charged particles such as plasma or the like generated on the gate electrode during the manufacturing process can be destaticized through the bypass film.

The solid state image device according to the present invention comprises a bypass film made of an insulation film through which a leak current is able to easily flow as compared with a gate insulation film, the bypass film being formed between a wiring for connecting gate electrodes of MOS transistors and a drain region. Therefore, charged particles made incident on the gate electrode are allowed to flow to the substrate through the bypass film formed below the wiring and permitting a leak current to easily flow. As a result, charging of the gate insulation film formed below the gate electrode of the MOS transistor, which causes the characteristics of the MOS transistor to be changed, can be suppressed. Accordingly, the characteristics of the MOS transistor for each pixel can be made to be uniform and dispersion of the characteristics can be removed.

Since the method of manufacturing the solid state image device according to the present invention makes it possible that a work process is performed while effecting destaticization through the bypass film, charged particles such as plasma or the like generated on the gate electrode during the manufacturing process can be destaticized through the bypass film.

BRIEF DESCRIPTION OF THE DRAWINGS

FIG. 16A is a plan view showing an embodiment of a method of manufacturing the solid state image device according to the present invention;

FIG. 16B is a cross sectional view taken along line C–C' in FIG. 16A;

DETAILED DESCRIPTION OF THE PREFERRED EMBODIMENTS

Figure 1:
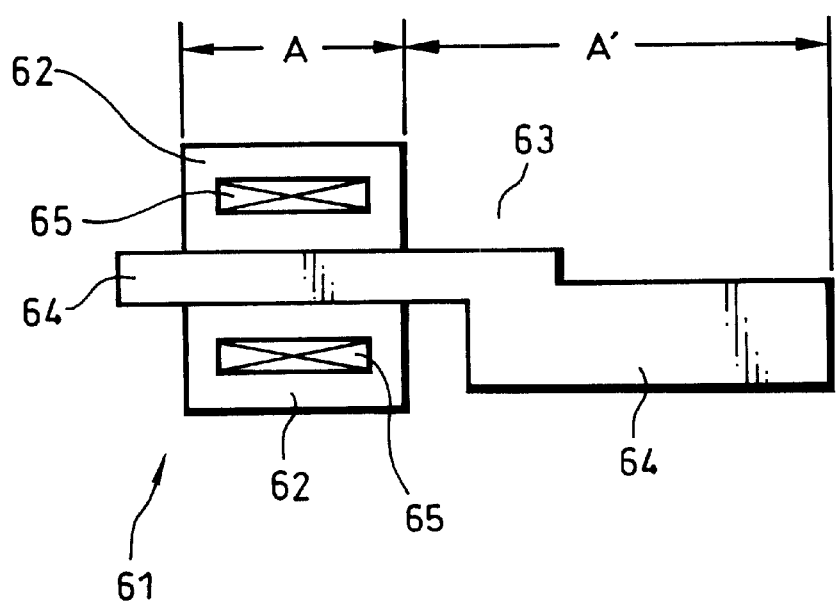
FIG. 1 is a schematic plan view showing a semiconductor apparatus.

Referring to the drawings, embodiments of a semiconductor apparatus, a manufacturing method therefor, a solid state image device and a manufacturing method therefor according to the present invention will now be described.

Figure 2:
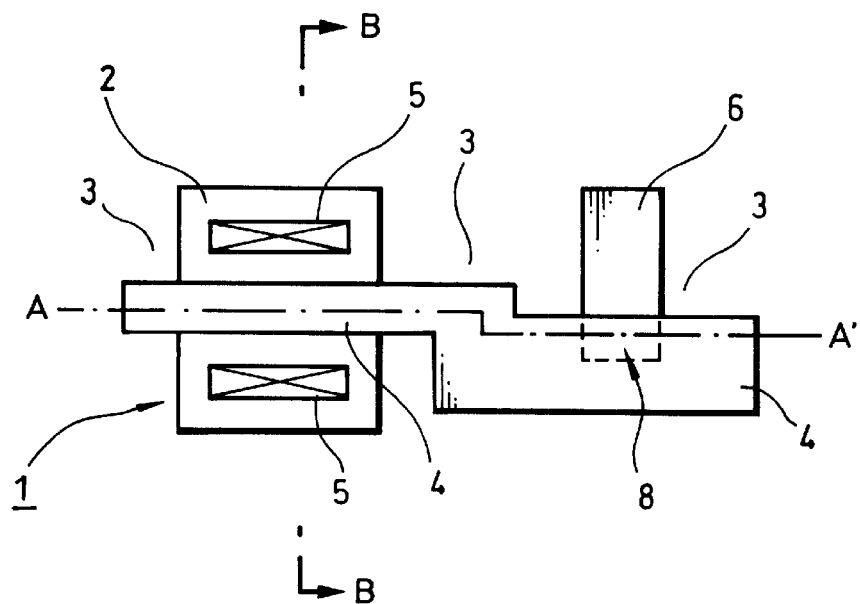
FIG. 2 is schematic plan view showing an embodiment of a semiconductor apparatus according to the present invention.
Figure 3:
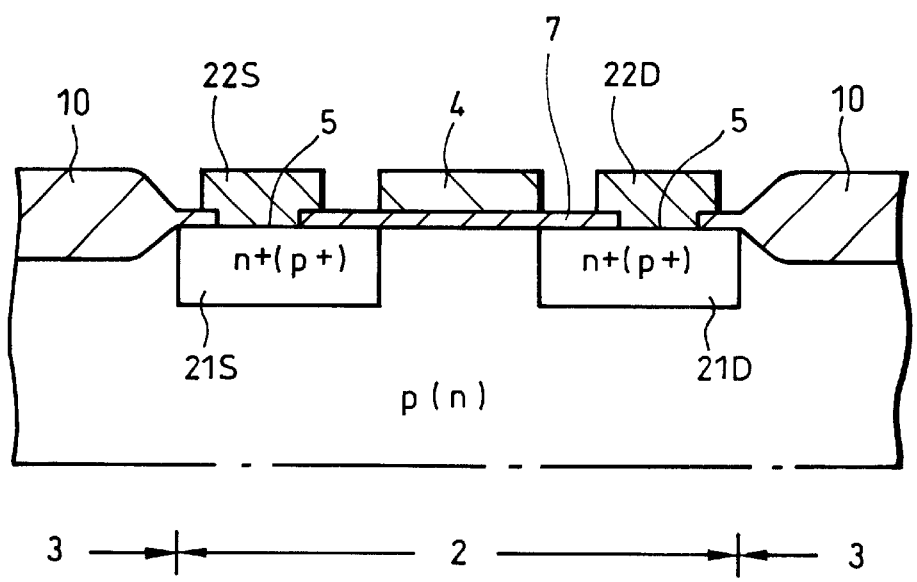
FIG. 3 is a cross sectional view of the semiconductor apparatus taken along a line B–B' in FIG. 2.

FIG. 2 shows a MIS transistor 1 which is a part of the semiconductor apparatus according to the embodiment of the present invention. Similarly to the structure shown in FIG. 1, the MIS transistor 1 is formed in an active region 2 isolated by a field region 3. A gate electrode 4 is formed over the active region 2 and the field region 3 formed around the active region 2. As shown in FIG. 3 which is a cross sectional view taken along line B–B' in FIG. 2, the active region 2 is formed such that a second-conduction-type source region 21S and drain region 21D are formed across the gate electrode 4 on the main surface of a first-conduction-type silicon substrate 9. A source electrode 22S and a drain region 22D are connected, through a contact portion 5, to the source region 21S and the drain region 21D, respectively. Reference numeral 7 represents a gate insulation film 7 and 10 represents a field insulation film formed in the field region 3 by selective oxidation.

Figure 4:
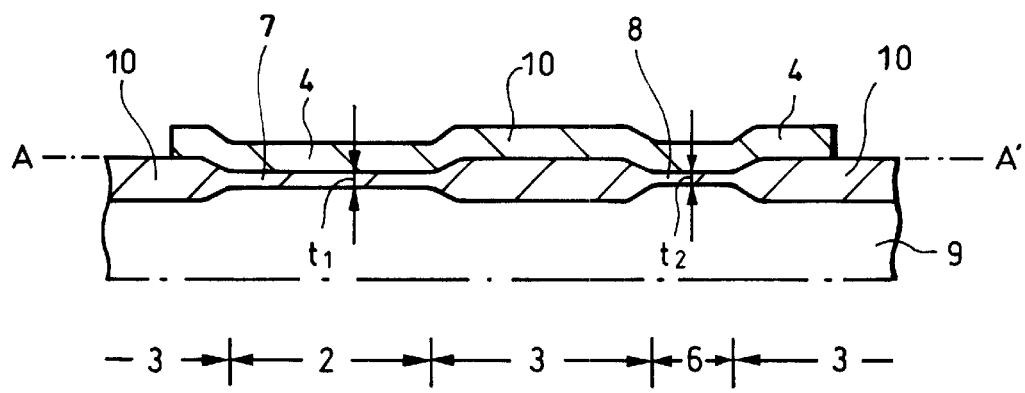
FIG. 4 is a cross sectional view showing the semiconductor apparatus taken a along line A–A' in FIG. 2.

As shown in FIG. 4 which is a cross sectional view taken along line A–A' in FIG. 2, this embodiment is formed such that a discharging active region 6 is formed in a part of the field region 3. In the discharging active region 6, there is formed a bypass film 8 (thickness $t_2$, where $t_2 < t_1$) made of an insulation film having a thickness smaller than that of the gate insulation film 7 (thickness $t_1$) in the active region 2 of the MIS transistor 1. The gate electrode 4 is formed to extend over the bypass film 8. In this embodiment, the bypass film 8 is made of the same material as that of the gate insulation film 7.

Figure 5:
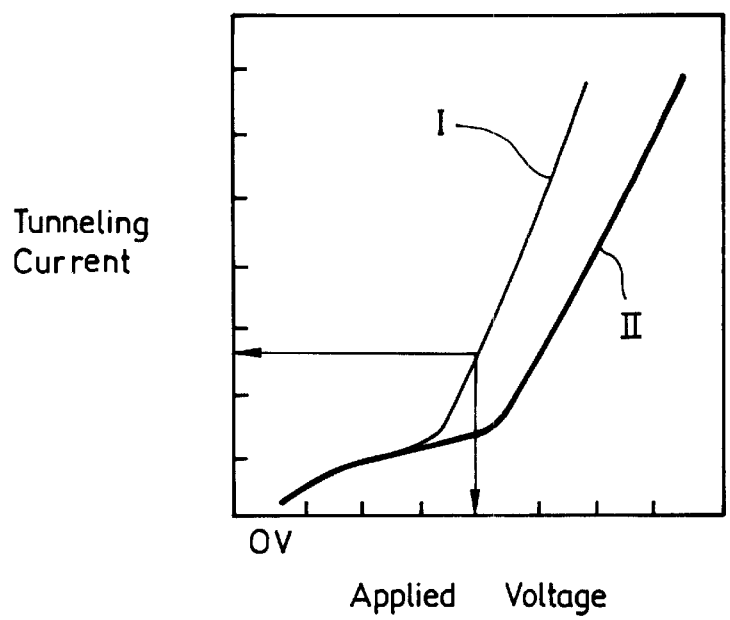
FIG. 5 is a graph showing the relationship between an applied voltage to an insulation film and a tunnel current.

If the gate insulation film 7 is a silicon oxide film, a F-N current (a Fowler-Nordheim current) starts to flow from about 5 MV/cm which is obtained by converting the voltage of the gate electrode 4 to voltage. A comparison of a F-N current in a thin gate insulation film and that in a thick gate insulation film is shown in FIG. 5. In the thin gate insulation film (curve I), the F-N current starts flowing at a voltage lower than that at which the F-N current starts flowing in the thick gate insulation film (curve II). If applied voltage are the same, a tunnel current, by two or more digits, larger than a tunnel current, which flows in the thick gate insulation film, flows in the thin gate insulation film.

The tunnel current is exponentially changed with respect to the applied voltage.

Therefore, when a voltage is applied to the gate insulation film 7 due to charging up of the gate electrode 4, charges are therefore moved to the silicon substrate 9 through the thin bypass film 8 formed as a bypass film. Thus, undesirable rise in the potential of the gate electrode 4 to the voltage at which the F-N current starts flowing through the gate insulation film 7 of the MIS transistor 1 can be prevented.

As a result, change in the threshold voltage $V_{th}$ of the MIS transistor 1 can effectively be suppressed.

The destaticizing effect of the bypass film 8 can be improved in inverse proportion to the thickness of the bypass film 8. Although the bypass film 8 must be formed so as to be thinner in a design condition where the quantity of incidental current of plasma ions is large, it might be considered feasible to selectively removing the wiring of the electrode on the bypass film 8 by etching in a latter process to prevent flow of the F-N current due to the operating voltage when the circuit is operated.

However, the above etching is not so good because the destaticizing effect against etching itself and the charging up which is performed in the latter process is lost.

Since the tunnel current increases exponentially when the thickness is reduced, reduction in the thickness of the bypass film 8 as compared with the thickness of the gate insulation film 7 of the transistor by about 20% to about 60% is sufficient. Also the area of the bypass film 8 may be a small area. It is most preferable that the thickness of the bypass film 8 be a value with which the electric field which is applied to the gate insulation film 7 in a state where the circuit is being operated does not exceed 5 MV/cm.

That is, the film thickness is adjusted in such a manner that the electric field, which is applied to the gate insulation film 7, does not exceed 5 MV/cm at the required voltage.

In a case of a transistor comprising a gate film having a thickness of 20 nm and arranged to be applied with a voltage level of 5 V, the thickness of the bypass film 8 is required to be larger than 10 nm, that is, about 11 nm.

As a result, flow of the tunnel current through the bypass film 8 is prevented in a state where the circuit is being operated. Thus, the operation of the circuit is not affected adversely.

If the gate electrode 4 is charged up during the plasma process, the structure of this embodiment arranged such that the electric current allowed to pass through the gate insulation film 7 is bypassed by the bypass film 8 formed in a portion different from the active region 2 of the MIS transistor 1 is able to prevent change in the threshold voltage $V_{th}$ in the gate insulation film 7 in the gate portion. Therefore, dispersion of $V_{th}$ can be prevented and the surface levels can be reduced.

As a result, $V_{th}$ can be made uniform, and thus the voltage required for the circuit can be lowered and the thickness of the film can be reduced.

Moreover, a designed threshold voltage $V_{th}$ of the MIS transistor can be realized.

Since the gate insulation film 7 is not damaged during the process, an excellent quality of the film can be obtained.

Moreover, deterioration in the device occurring due to hot carriers to which the device will be exposed later can be prevented.

In addition, a permissible range for the plasma process can be enlarged. Thus, a means for improving the productivity can be employed by, for example, the density of plasma being raised to increase the etching rate.

The above-mentioned structure of the semiconductor apparatus may be similarly employed regardless of the type of the channel of the transistor, whether an channel is a n-channel or the p-channel.

In the above-mentioned structure, the bypass film 8 is formed between the discharging active region 6 formed in the field region 3 around the active region 2 of the MIS transistor 1 and the gate electrode 4. The structure of the semiconductor apparatus according to the present invention may be employed to a structure in which the thin bypass film 8 is formed in another portion below the gate electrode. An example of this structure will now be described.

Figure 6:
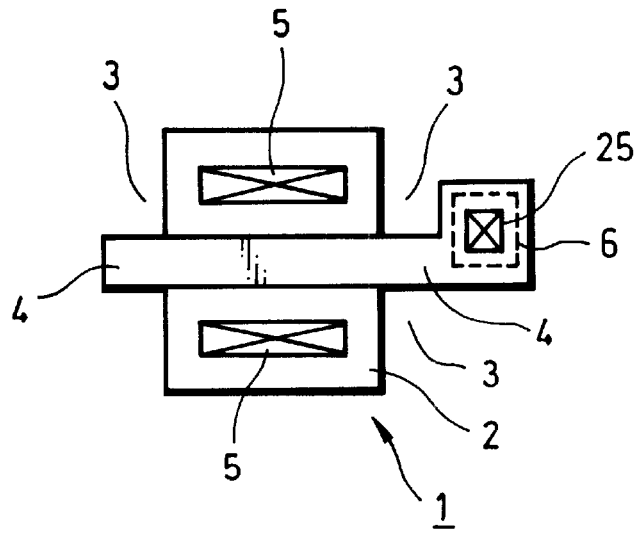
FIG. 6 is a schematic plan view showing another embodiment of the semiconductor apparatus according to the present invention.

In this structure, as shown in FIG. 6, a small discharging active region 6, in which a thin bypass film 8 is formed is formed at a position of a contact portion 25 between the gate electrode 4 and an Al wiring which is thereafter formed on the gate electrode 4 to be connected thereto. The portion of the gate electrode 4 in the contact portion 25 covers the discharging active region 6. Since the other structures are arranged similarly to those according the embodiment shown in FIG. 2, the same reference numerals are given to the similar structures and description thereof is omitted.

In this structure, the bypass film 8 is formed below a drawout pad or the like of the contact portion 25 between the gate electrode 4 and the Al wiring. Therefore, enlargement of the area which takes place due to forming of the discharging active region 6 and the bypass film 8 can be avoided and thus an advantage can be realized in that the area can be minimized.

In each of the above-mentioned embodiments, the active region 2 of the MIS transistor 1 having the channel for performing the transistor operation and the discharging active region 6 in which the bypass film 8 is formed are completely isolated from each other by field insulation for isolating the devices.

The reason for this lies in that adverse influence on the characteristic of the transistor must be prevented even if a discharging region is realized in the same active region 2 by the bypass film 8. Therefore, a variety of limitations thus-raised can easily and reliably be cleared when the structure according to the above-mentioned embodiments is employed though a somewhat large area is required.

Although various limitations must be cleared when the discharging region is formed by the bypass film 8 when the bypass film 8 is formed in the same active region, an advantage can be realized in which only a small area is required to form the bypass film 8. An example of this structure will now be described.

Figure 7:
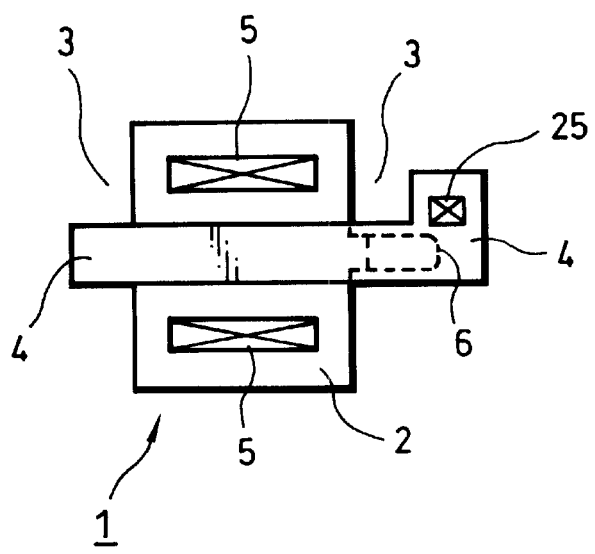
FIG. 7 is a schematic plan view showing a further embodiment of the semiconductor apparatus according to the present invention.

FIG. 7 shows an embodiment in which a portion of the active region 2 of the MIS transistor 1 is enlarged along the gate electrode 4 to reach the outside portion of the channel of the MIS transistor 1. Moreover, the enlarged portion of the active region 2 is served as a discharging active region 6 in which the thin bypass film 8 is formed apart from the channel of the MIS transistor 1.

The above structure is effective when the narrow channel effect of the source/drain of the MIS transistor 1 is not affected adversely. Since the discharging active region 6 is formed below the gate electrode 4 extending to the contact portion 25 with the wiring, also this structure is able to form a discharge region by the bypass film 8 with a small area.

Since the other structures are the same as those according to the embodiments shown in FIGS. 2 and 6, the same elements are given to the similar portions and the similar portions are omitted from description.

Figure 8:
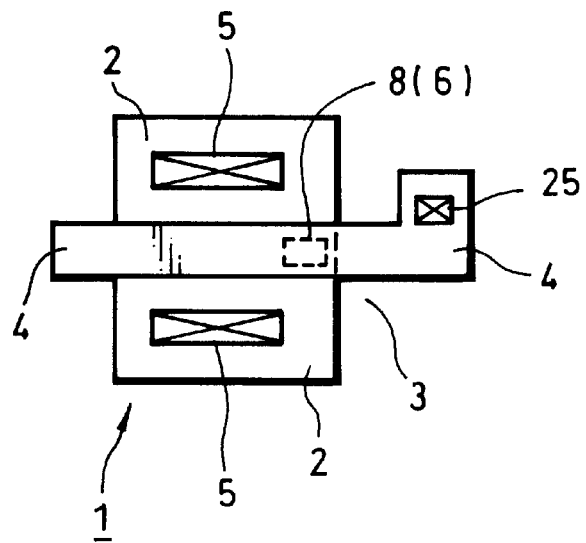
FIG. 8 is a schematic plan view showing a yet another embodiment of the semiconductor apparatus according to the present invention.

An embodiment shown in FIG. 8 has a structure in which the discharging region 6 by the bypass film 8 is formed in the channel of the MIS transistor 1, that is, in the active region 2. If the length of the gate can be elongated, the overall area of the device can be minimized as compared with the other structures.

Figure 9:
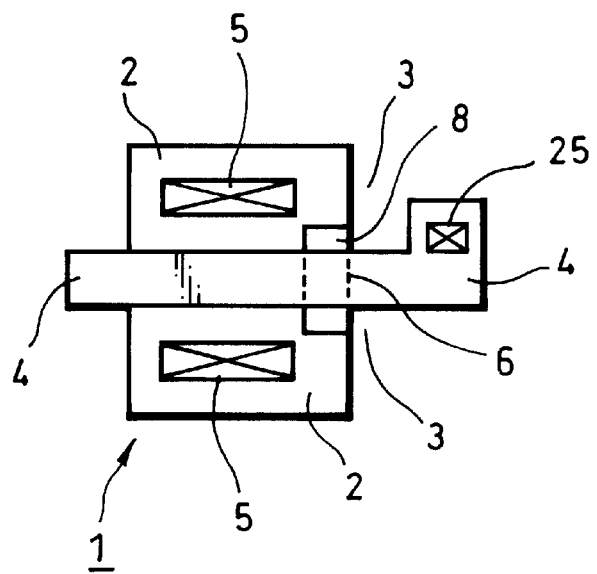
FIG. 9 is a schematic plan view showing a still another embodiment of the semiconductor apparatus according to the present invention.

An embodiment shown in FIG. 9 is, similarly to the embodiment shown in FIG. 8, formed such that the discharging region 6 by the bypass film 8 is formed to traverse the channel of the MIS transistor 1. This structure can be applied to a structure in which the gate has a short length.

Since the discharging region 6 by the bypass film 8 directly affects the characteristics of the MIS transistor in this case, implantation of additional ions to a portion below the bypass film 8 or the like must be performed to raise the $V_{th}$ for the purpose of controlling the characteristics.

Figure 12:
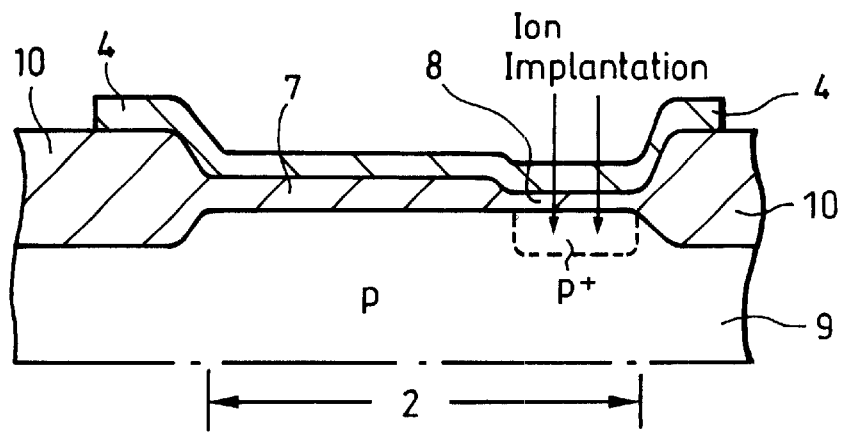
FIG. 12 is a diagram showing a case where a portion below a bypass film is brought to a high $V_{th}$ by an ion implantation.

To this end, high concentration $p_+$ions are implanted into a portion below the bypass film 8, that is, a p-type silicon substrate 9 in this embodiment through the polysilicon layer of the gate electrode 4, as shown in FIG. 12 which is a cross sectional view.

As a result, the portion below the bypass film 8 is brought to a high concentration state and also the $V_{th}$ is raised when the MIS transistor 1 is being operated. Therefore, flow of the tunnel current through the bypass film 8 can be prevented.

Since the structures shown in FIGS. 8 and 9 are additionally formed in such a way that the device isolation pattern for forming the active region of the MIS transistor 1 is not changed, the discharging region 6 by the bypass film 8 can be formed even after the design of the layout of the circuit has been completed.

Although each of the above-mentioned embodiments has the structure in which the thin portion of the gate insulation film made of the oxide film is made to be the bypass film 8 to create the discharging region 6, that is, the so-called bypass region, the bypass film is simply required to be a film through which the leak current is able to easily flow as compared with the gate film of the transistor. For example, the bypass film 8 may be a film having a silicon nitride film.

Referring to the drawings, a method of manufacturing the semiconductor apparatus according to the present invention will now be described, that is, an embodiment will now be described in which the bypass film 8 is provided for the MIS transistor 1.

This embodiment will now be described about a structure in which the active region 2 of the MIS transistor 1 and the discharging active region 6 are formed to be separated from each other. Note that also the manufacturing method according to the present invention may be applied to a structure in which the discharge region by the bypass film 8 is formed in the active region 2 of the MIS transistor 1.

Figure 10A:
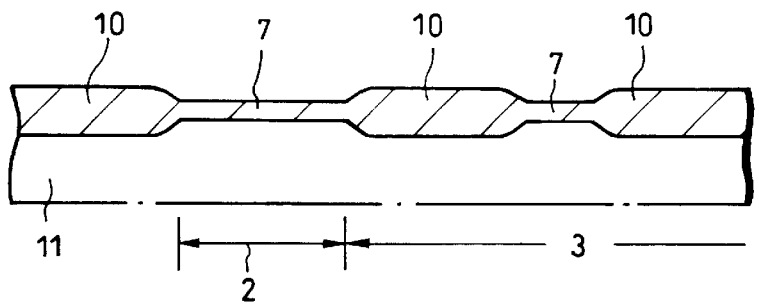
FIGS. 10A to 10D are diagrams showing the manufacturing processes according to an embodiment of a method of manufacturing a semiconductor apparatus according to the present invention.

As shown in FIG. 10A, the surface of a substrate region 11 made of a first-conduction-type silicon semiconductor is selectively oxidized so that the field insulation layer 10 is formed for isolating devices. Then, the gate insulation film 7 is formed in the active region 2 of the MIS transistor 1 surrounded by the field insulation layer 10 and a part of the field region 3, that is, a portion which will be formed into the discharging region. At this time, the thickness of the gate insulation film 7 formed on the channel of the active region 2 of the MIS transistor 1 is adjusted to realize required characteristics of the MIS transistor 1.

Figure 10B:
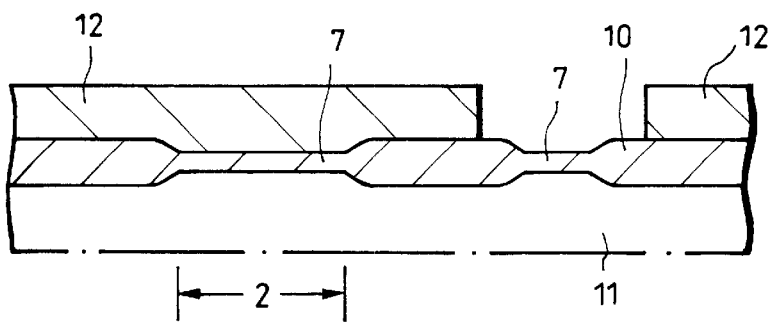

Thereafter, a resist 12 is formed on the surface, as shown in FIG. 10B, and then the resist 12 is patterned so that an opening is formed in a portion which will become the discharging region.

Figure 10C:
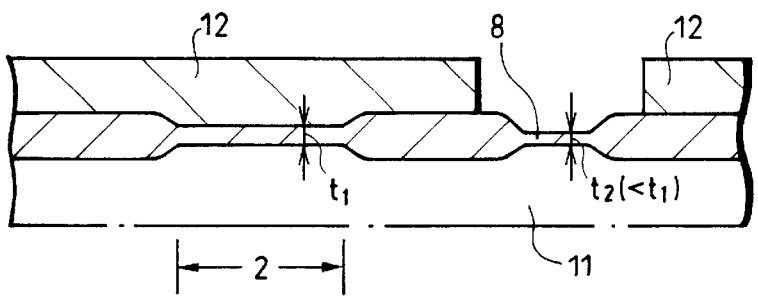

Then, the gate insulation film 7 at the position which will be the discharge region is wet-etched from the opening in the resist 12 to be reduced in thickness, and then, a bypass film 8 having a thickness $t_2(t_1>t_2)$ which is smaller than the thickness $t_1$ of the gate insulation film 7 is formed in the region as shown in FIG. 10C.

Figure 10D:
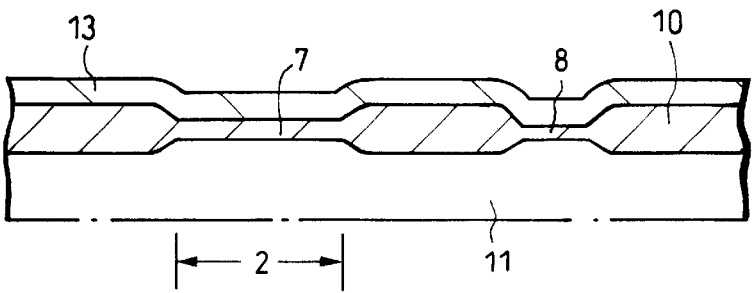

Then, the resist 12 is stripped, and then a polysilicon layer 13 which covers the overall product and which will be formed into the gate electrode 4 is allowed to grow, as shown in FIG. 10D.

Then, the polysilicon layer 13 is patterned in a manner not shown so that the gate electrode 4 is formed. Charged particles made incident on the polysilicon layer 13 when the patterning process is performed are destaticized through the thin bypass film 8 and then allowed to flow to the substrate region 11.

The second-conduction-type source region and the drain region are, by ion implantation or the like, formed in the substrate region 11 before the gate electrode 4 is formed or the same has been formed.

Then, a usual process is performed so that a required semiconductor apparatus is manufactured.

Another embodiment of the manufacturing method according to the present invention will now be described.

Figure 11A:
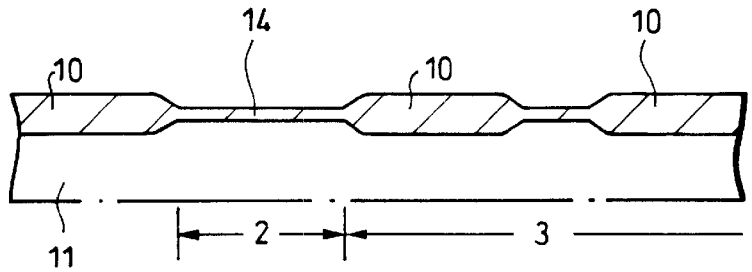
FIGS. 11A to 11D are diagrams showing the manufacturing processes according to another embodiment of the method of manufacturing a semiconductor apparatus according to the present invention.

Initially, the field insulation layer 10 for isolating devices is, by selective oxidation, formed on the surface of the substrate region 11 made of the first-conduction-type silicon semiconductor, as shown in FIG. 11A. Then, a first gate-insulation-film 14 is thinly formed in the active region 2 of the MIS transistor 1 surrounded by the field insulation layer 10 and a portion of the field region 3, that is a portion which will become the discharging region by heat oxidization or the like.

Figure 11B:
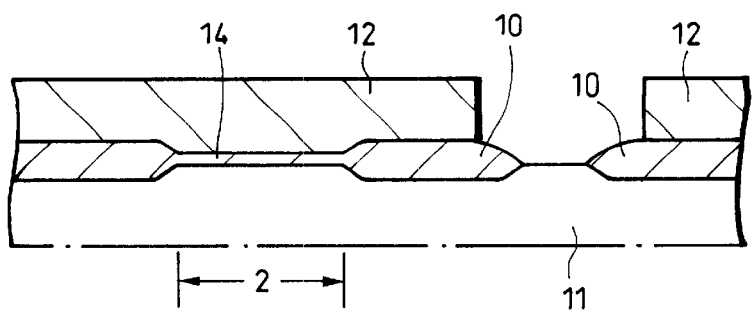

Then, as shown in FIG. 11B, a resist 12 is formed on the surface, and the resist 12 is, by lithography, patterned so that an opening is formed in a portion which will become the discharging region. Then, the first gate-insulation-film 14 in a portion which will be formed into the discharging region is etched off through the opening so as to be completely or substantially removed.

Figure 11C:
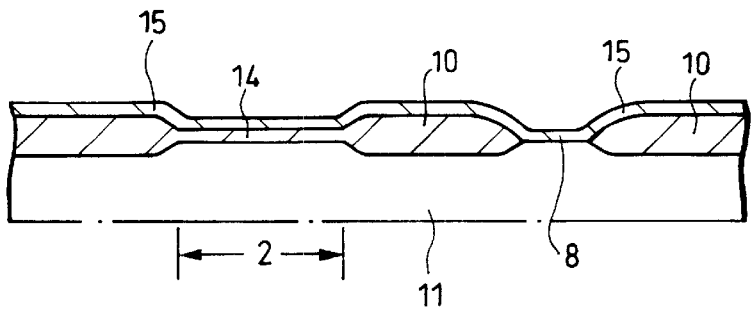

After the resist 12 has been striped off, a relatively thin second gate-insulation-film 15 is formed to cover the surface, as shown in FIG. 11C. With the second gate-insulation-film 15, the thin bypass film 8 is formed in the discharging region. The gate insulation film 7 in the active region 2 is formed by a stacked film of the first gate-insulation-film 14 and the second gate-insulation-film 15.

Figure 11D:
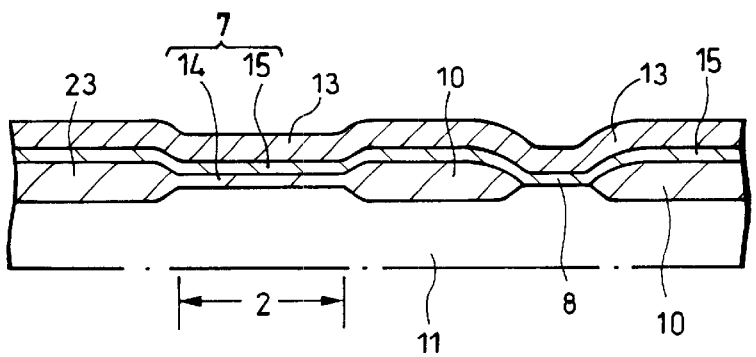

Then, the polysilicon layer 13, which will be formed into the gate electrode 4, is formed to cover the surface, as shown in FIG. 11D.

Then, the polysilicon layer 13 is patterned in a manner not shown so that the gate electrode 4 is formed. Also the manufacturing method according to this embodiment is arranged such that charged particles made incident on the polysilicon layer 13 are destaticized, similarly to the above-mentioned embodiments. The second-conduction-type source region and drain region are, by ion implantation or the like, formed in the substrate region 11 before the gate electrode 4 is formed or after the same has been formed.

Then, a usual process is performed so that a required semiconductor apparatus is manufactured.

The manufacturing method according to this embodiment results in that the thickness of the gate insulation film 7 on the channel of the MIS transistor 1 is the total sum of the thickness of the first gate-insulation-film 14 and that of the second gate-insulation-film 15. Therefore, the distribution of the thicknesses of the first and second gate-insulation-films 14 and 15 and the forming conditions therefor must be adjusted when the semiconductor apparatus is manufactured.

Referring to the drawings, the solid state image device and a method of manufacturing the solid state image device according to the present invention will now be described.

The solid state image device according to the present invention has a structure such that the pixel is formed by one MOS transistor. An amplifying-type solid state image device shown in FIG. 13, and more particularly the structure of the pixel of the same will now be described as an example of the solid state image device having the structure in which the pixel is formed by one MOS transistor before the embodiment of the present invention is described.

Figure 13:
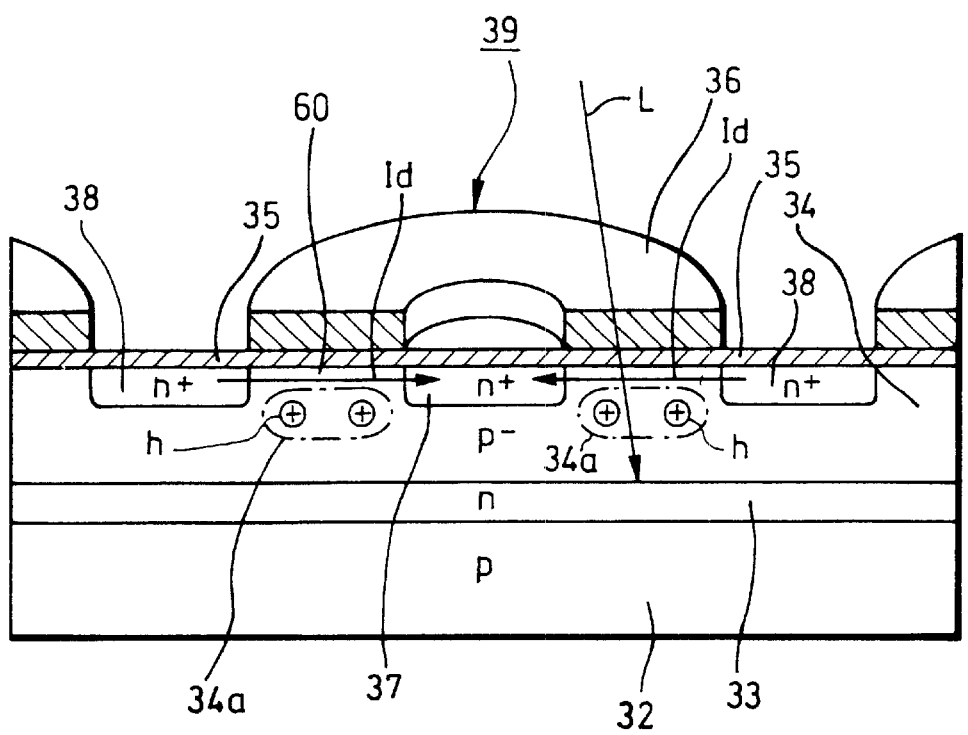
FIG. 13 is a diagram showing the structure of an amplifying-type solid state image device.

FIG. 13 is a perspective view showing a representative amplifying-type solid state image device 31 for one pixel in which a portion is in the form of a cross sectional view and the wiring is omitted.

The amplifying-type solid state image device 31 is structured in such a way that a second-conduction-type, that is, an n-type semiconductor layer (that is, an overflow barrier layer) 33 and a p-type well region 34 are formed on a first-conduction-type, for example, a p-type silicon semiconductor substrate 32. An annular gate electrode 36, through which light L is allowed to path is formed on the p-type well region 34 through a gate insulation film 35 made of $SiO_2$ or the like. An n-type source region 37 is formed in an inner region surrounded by the annular gate electrode 36 in the p-type well region 34. An n-type drain region 38 common to the other pixels is formed in a region outside of the gate electrode 36. A MOS transistor (hereinafter called as a pixel MOS transistor) 39 serving as one pixel is formed inside the n-type drain region 38. The annular gate electrode 36 is made of thin or transparent material to possibly prevent absorption of light L. In this embodiment, the annular gate electrode 36 is made of polycrystal silicon formed into a thin film.

Light L made incident passed through the gate electrode 36 is photoelectrically converted within the silicon substrate and positive holes h generated at positions shallower than the over-flow barrier layer 33 are accumulated in the p-type well region 34 below the gate electrode 36, that is, in a charge accumulating region 34a. After the positive holes h have been accumulated, a signal is read in such a way that the gate electrode 36 is turned on to read an electron current Id flowing in a channel portion 60 to the outside portion through the source. At this time, the electron current Id is modulated according to the charges (the positive holes) h accumulated in the charge accumulating region 34a.

A multiplicity of the pixel MOS transistors 39 each having the above-mentioned structure are arranged in a two-dimensional or one-dimensional fashion to obtain an output current which is changed according as the amount of the charges accumulated in each pixel. Thus, a two-dimensional or one-dimensional image signal can be obtained.

Figure 14:
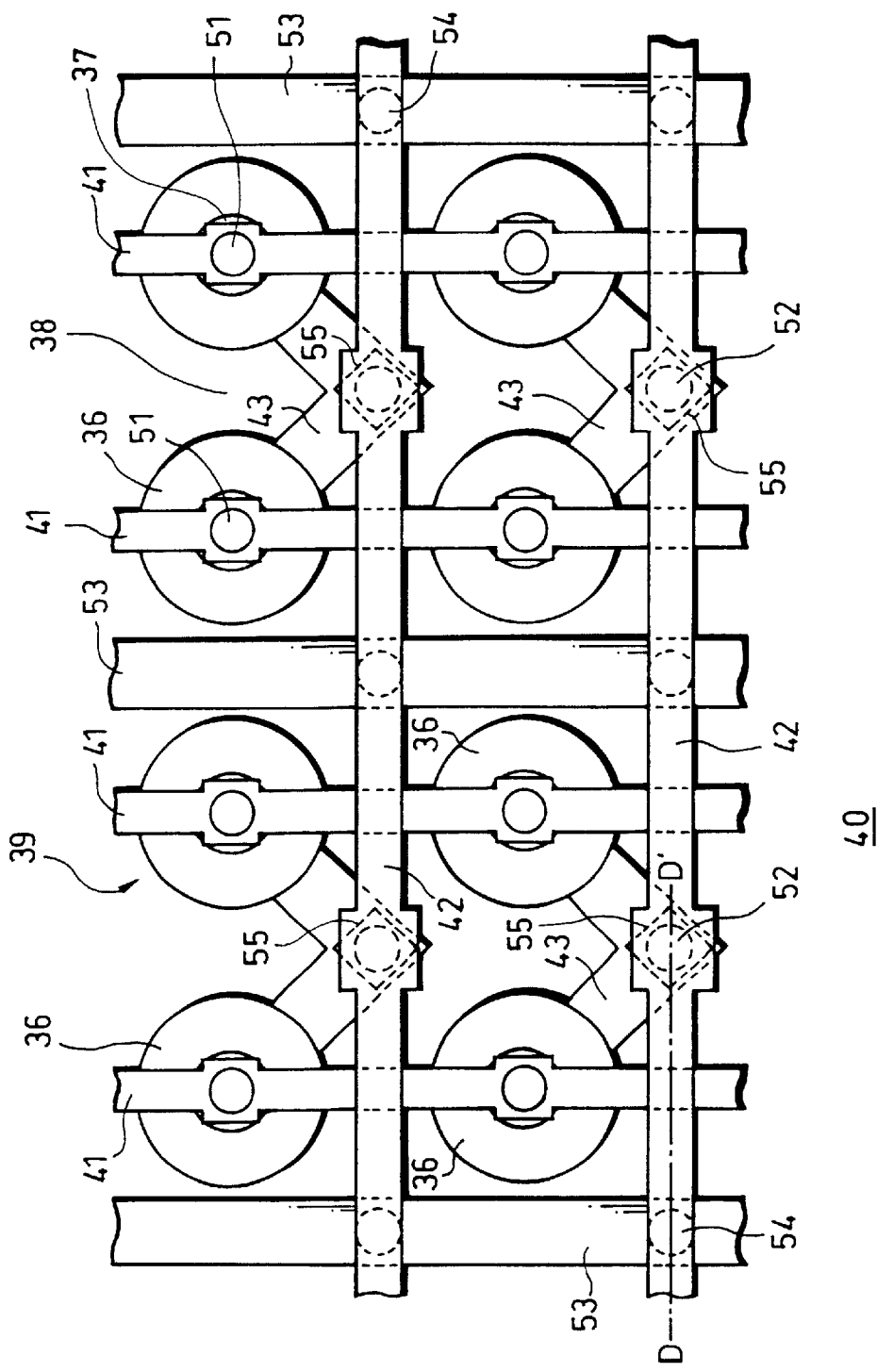
FIG. 14 is a schematic plan view showing a solid state image device according to the present invention.

FIG. 14 is a plan view showing an embodiment of the solid state image device according to the present invention. This embodiment is arranged such that the structure is applied to an amplifying-type solid state image device having the structure shown in FIG. 13.

An amplifying-type solid state image device 40 according to this embodiment has a plurality of MOS transistors 39 each having the same structure as that shown in FIG. 13 in a matrix form. The source region 37 of the pixel MOS transistor 39 corresponding to each column is, through a source contact portion 51, connected to a common signal line 41 made of a single Al layer formed in the vertical direction.

A V-shape wiring portion 43 is formed between two pixel MOS transistors 39 formed adjacent in the horizontal direction, the V-shape wiring portion 43 being formed by connecting ends of portions extending from the annular gate electrodes 36 to each other.

The wiring portion 43 is made of the same electrode material (that is, a conductive material) as that of the gate electrode 36 and formed integrally with the gate electrode 36. Each of the wiring portions 43 is formed by extension so as to be positioned between rows of the pixel MOS transistors 39 so that the connected end of the wiring portion 43 can be brought into contact with a vertical selection line 42.

The vertical selection line 42 made of, for example, a second Al layer is formed in the horizontal direction to be perpendicular to the said signal line 41 at position between rows of the pixel MOS transistor 39. The vertical selection line 42 and the connection end of the V-shape wiring portion 43 formed integrally with the gate electrode 36 are connected to each other by a gate contact portion 52.

Moreover, a drain power supply line 53 made of, for example, the a first Al layer connected to the drain region 38 is formed between the pixel MOS transistors 39 or the side where the wiring portion 43 is not formed. The drain power supply line 53 and the drain region 38 are connected to each other through a drain contact portion 54.

This embodiment has a structure that the insulation film at the position where the gate contact portion 52 is formed, that is, the insulation film formed between the wiring portion 43 (a portion corresponding to that gate contact portion 52) for connecting the gate electrodes 36 of the MOS transistors for forming pixels and the drain region 38 is formed into a bypass film 55 through which leak currents in the film are able to flow easily.

Figure 15:
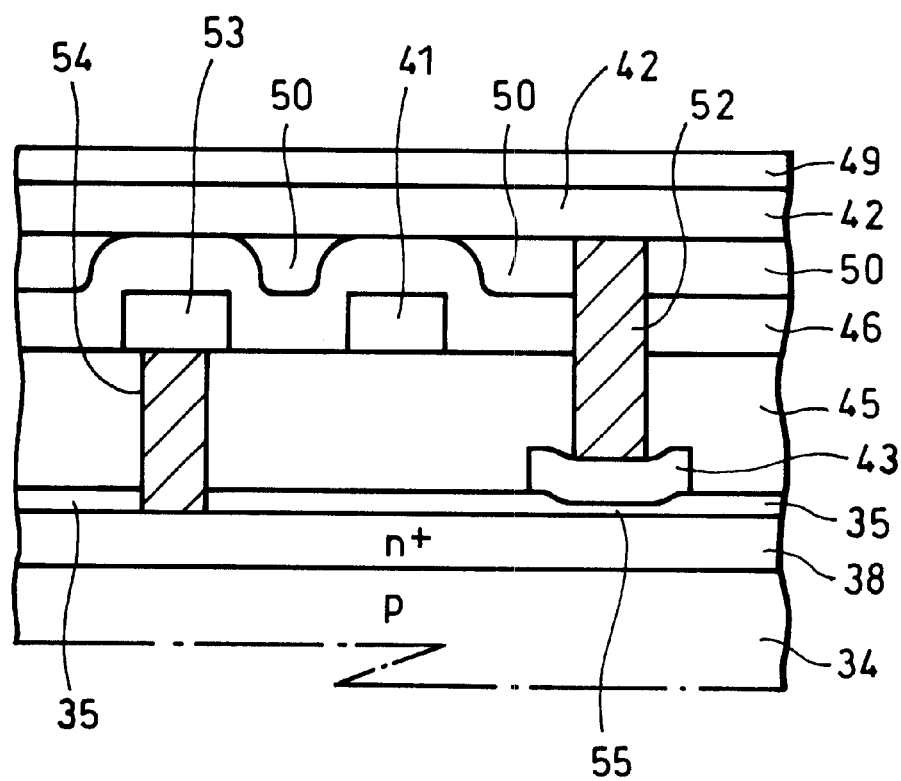
FIG. 15 is a cross sectional view showing the solid state image device (the amplifying-type solid state image device) taken along line D–D' in FIG. 14.

As shown in FIG. 15 which is a cross sectional view taken along line D–D' in FIG. 14, the gate insulation film 35 made of, for example, a SiO$_2$ film formed on the drain region 38 on the surface of the p-type well region 34 is formed into the thin bypass film 55 below the wiring portion 43 at the position of the gate contact portion 52. Thus, electric currents in the film are able to flow easily as compared with the environment.

A flat layer 45 made of BPSG (Boron Phosphorus Silicate Glass) or the like is formed between the upper wiring and the gate insulation film 35. The signal line 41 and the drain power supply line 53 which are wiring layers formed by the first Al layer are formed on the flat layer 45. The signal line 41 and the source region 37 are connected to each other through the source contact portion 51 in a manner not shown. The interlayer insulation film 46 is formed to cover the wiring layers 41 and 53. A flat layer 50 for flattening the upper surface is formed on the interlayer insulation film 46. Then, the wiring layer made of the second Al layer, that is, the vertical selection line 42 is formed on the flat layer 50. Finally, an insulation film 49 covers the surface.

At the portion where the wiring portion 43 and the vertical selection line 42 are connected to each other, the wiring portion 43 extending from the gate electrode 36 and the vertical selection line 42 are connected to each other through the gate contact portion 52 made of a conductive layer formed on the wiring portion 43.

According to this embodiment, charged particles made incident on the gate electrode 36 flow to the substrate side through the bypass film 55 which is formed in the film below the wiring portion 43 and through which leak currents are able to easily flow. Therefore, charging of the gate insulation film 35 below the gate electrode 36 of the pixel MOS transistor 39, which causes the characteristics of the pixel MOS transistor 39 to be changed, can be suppressed.

Therefore, the characteristics of the pixel MOS transistors 39 can be made to be uniform and thus dispersion of the characteristics of the pixel MOS transistors 39 can be removed. As a result, a solid state image device which is capable of suppressing fixed pattern noise and obtaining excellent image quality can be manufactured.

A method of manufacturing the amplifying-type solid state image device 31 to which the method of manufacturing the solid state image device according to the present invention is applied will now be described.

As shown in FIG. 16A, which is a plan view and FIG. 16B which is a cross sectional view taken along line C–C' FIG. 16A, the gate insulation film 35 of the pixel MOS transistor 39 is formed on the p-type well region 34. Moreover, the bypass film 55, which is thinner than the gate insulation film 35, is formed on a part of the p-type well region 34.

The gate insulation film 35 and the bypass film 55 thinner than the gate insulation film can be formed by the methods shown in FIGS. 10 and 11.

Figure 16C:
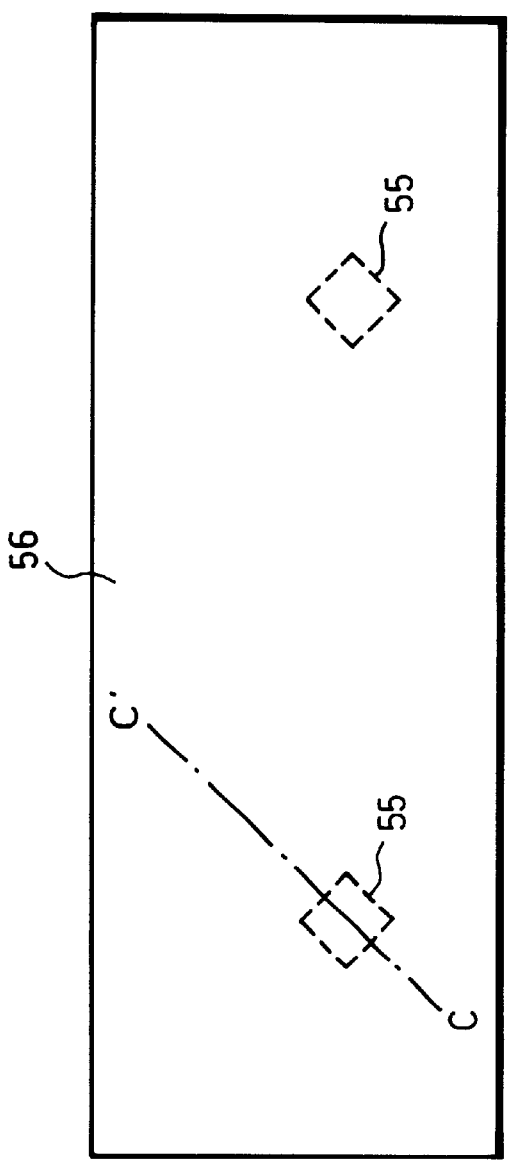
FIG. 16C is a plan view showing a manufacturing process of a modified embodiment of the method of manufacturing the solid state image device according to the present invention.
Figure 16D:
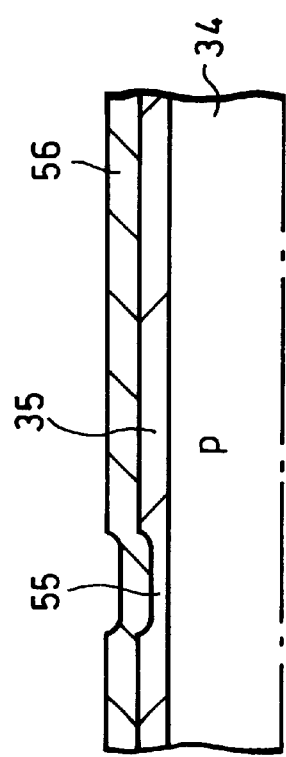
FIG. 16D is a cross sectional view taken along line C–C' in FIG. 16C.

As shown in FIG. 16C, which is a plan view, and FIG. 16D which is a cross sectional view taken along line C–C' in FIG. 16C, a polysilicon layer 56 which covers the surface and which will be formed into the gate electrode is formed.

Figure 16E:
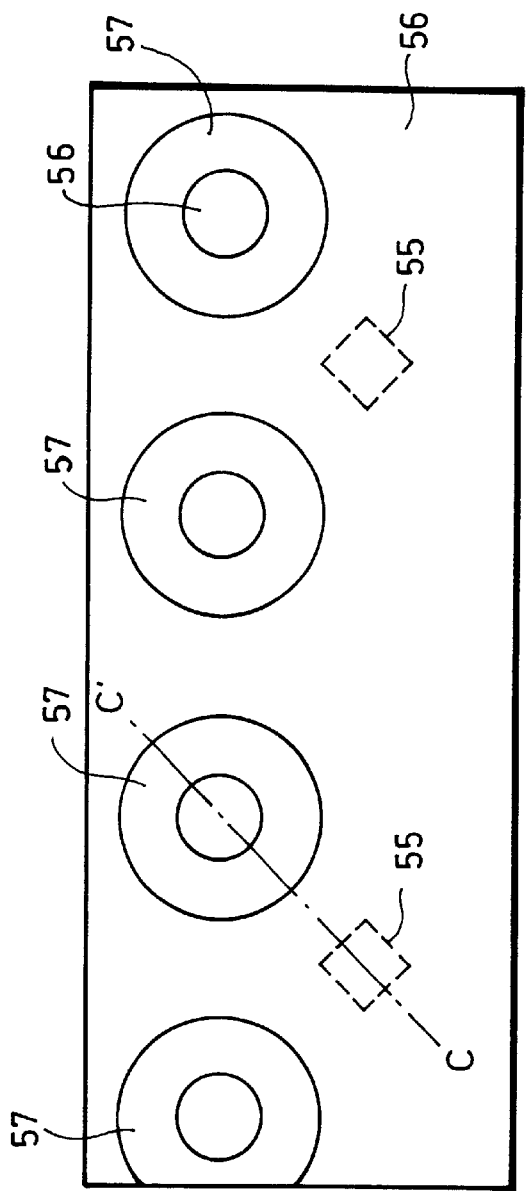
FIG. 16E is a plan view showing a manufacturing process of another modified embodiment of the method of manufacturing the solid state image device according to the present invention.
Figure 16F:
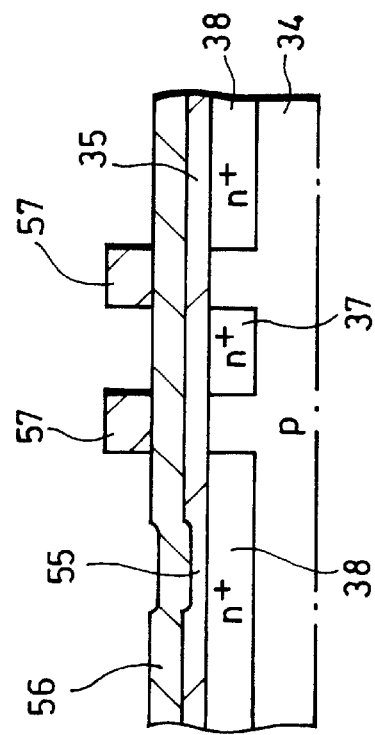
FIG. 16F is a cross sectional view taken along C–C' in FIG. 16E.

As shown in FIG. 16E, which is a plan view, and FIG. 16F which is a cross sectional view taken along line C–C' in FIG. 16E, an annular resist pattern 57 for determining the gate electrode of the pixel is formed on the polysilicon layer 56. The annular resist pattern 57 is used as a mask to implant n+ions through the polysilicon layer 56 which will be formed into the gate electrode so that the source region 37 is formed in the portion inside of the annular portion and the drain region 38 is formed in the portion outside of the same.

Thus, charged particles made incident on the polysilicon layer 56 during the ion implantation flow to the substrate through the bypass film 55. As a result, an effect of preventing electrification of the gate electrode can be expected.

Figure 16G:
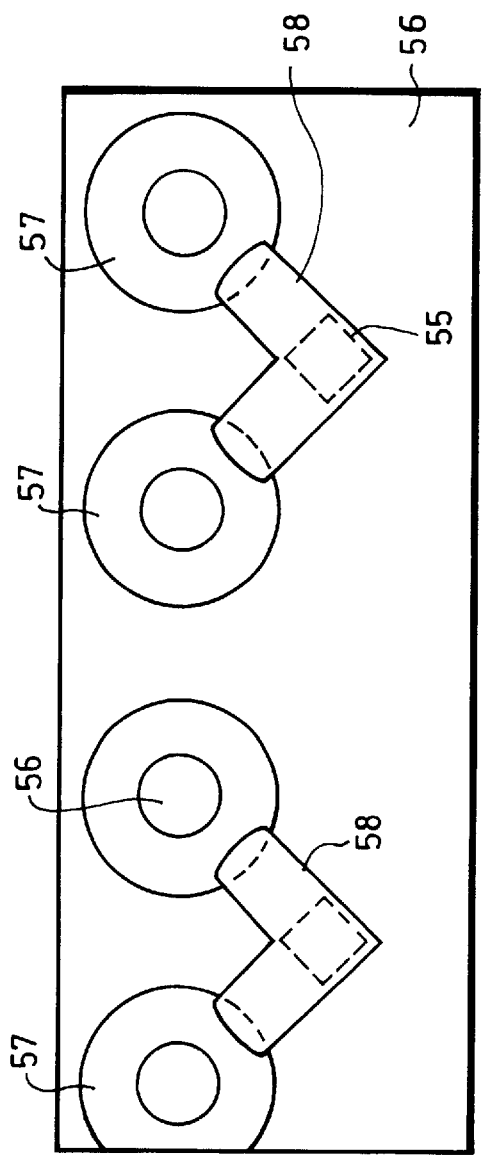
FIGS. 16G and 16H are diagrams showing a manufacturing process of a further modified embodiment of the a method of manufacturing the solid state image device according to the present invention.

Then, as shown in FIG. 16G which is a plan view, a second resist layer, that is, a wiring resist pattern 58 having a pattern corresponding to the pattern of the wiring portion for connecting the gate electrodes of two pixels to each other is formed in such a manner that the wiring resist pattern 58 partially overlaps the annular resist pattern 57.

Figure 16H:
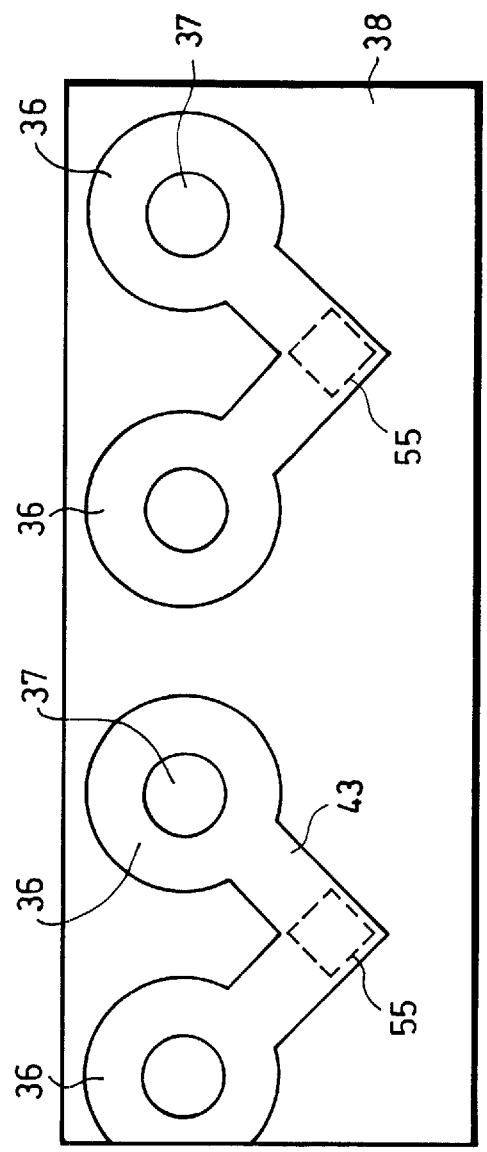

Then, as shown in FIG. 16H which is a plan view, the resist pattern 57 and the wiring resist pattern 58 are used as masks to etch the polysilicon layer 56 so that the gate electrode 36 and the wiring portion 43 are formed. When the gate electrode 36 and the wiring portion 43 themselves are worked, also charges occurring due to the plasma process can also be discharged through the bypass film 55. A similar effect can be obtained against oxygen plasma which is used in the following resist stripping process.

Also in a number of plasma processes for forming the contact portion, wiring the vertical selection line 42 and signal line 41 and flattening the surface by etching back and so on carried out thereafter, charges introduced into the gate electrode 36 of the pixel MOS transistor 39 are always discharged through the bypass film 55. Therefore, substantially no electric current flows in the gate insulation film 35 itself below the gate electrode 36. As a result, generation of the fixed charges and surface levels during the plasma process which has occurred with the conventional structure can be prevented.

As described above, the solid state image device 40 having the structure shown in FIGS. 14 and 15 can be manufactured in such a way that generation of fixed charges and surface levels in the gate insulation film 35 does not occur and characteristics of the pixels are made to be uniform.

The bypass film 55 may be retained as it is if the thickness of the bypass film 55 satisfies the range which will now be described. If the bypass film 55 is made of the same oxide film as that forming the gate insulation film 35 of the pixel transistor, the thickness of the bypass film 35 must be smaller than that of the gate insulation film 35 and the thickness does not raise the electric field, which is the difference between the potential of the drain and that of the gate when the device is being operated, to a level not exceeding 5 MV/cm.

Although each of the above-mentioned embodiments is structured in such a way that the bypass film is made of the silicon oxide film or the like, the bypass film may have another film structure. Also in this case, the film must be structured in such a manner that the leak takes place easier than the gate insulation film in the gate portion but such a phenomenon that tunnel currents are able to pass through the bypass film when the circuit is being operated and thus the operation of the circuit is adversely affected is avoided. Therefore, for example, a film containing a silicon nitride film may be employed as the bypass film.

According to the semiconductor apparatus and the method of manufacturing the same according to the present invention, an electric current which flows through the gate insulation film is bypassed by the bypass film formed at a separate portion even if the gate electrode is charged up due to the plasma process. Therefore, change in the threshold voltage $V_{th}$ in the gate insulation film in the gate portion can be prevented, dispersion of the voltage $V_{th}$ can be prevented and surface levels can be reduced.

Since the semiconductor apparatus and the method of manufacturing the same according to the present invention is able to make the voltage $V_{th}$ to be uniform, the voltage required for the circuit can be lowered and the thickness of the gate can be reduced. As a result, dispersion of the characteristic of the devices of the analog circuit comprising the MIS transistors can be reduced.

Since a designed $V_{th}$ of the transistor can be realized, the apparatus can be manufactured with a satisfactory yield.

Since the gate insulation film is not damaged during the process, the quality of the gate insulation film can be improved. Thus, deterioration in the device occurring due to the following hot carriers can be reduced.

Moreover, the semiconductor apparatus and the manufacturing method therefor of the present invention are able to enlarge the permissible range for the plasma process. For example, the plasma density can be raised to increase the etching rate for the purpose of improving the productivity.

In addition, the conditions of the manufacturing apparatus can be widened so that the semiconductor apparatuses are stably manufactured.

The solid state image device according to the present invention has the structure that the bypass film permitting an electric current to easily flow as compared with the gate film is formed on the drain of the pixel transistor. Therefore, charged particles made incident on the gate electrode can be destaticized and electrification of the gate electrode during all of the plasma processes including the process for working the gate electrode and the process for implanting ions can be suppressed.

Therefore, the present invention is able to prevent change and dispersion of the threshold voltage $V_{th}$ of the pixel transistor and generation of surface levels.

Since dispersion of the threshold voltage $V_{th}$ can be reduced, a solid state image device which is capable of suppressing fixed pattern noise and realizing an image having a good quality can be provided.

Since effective destaticization can be performed, a peripheral circuit and an external circuit for canceling the dispersion of the thresh old voltage $V_{th}$ are not required. Therefore, a solid state image device having a small size and a simple structure can be provided.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A semiconductor apparatus comprising:
   a MIS transistor, wherein
   a gate electrode of said MIS transistor extends over a bypass film, which is located other than within any active region and made of an insulation film through which a leak current is able to easily flow as compared with a gate insulation film of said MIS transistor under the same voltage level, said gate electrode also covering the gate insulation film of said MIS transistor.

2. A semiconductor apparatus according to claim 1, wherein said bypass film is made of a same material as that of said gate insulation film and a thickness of said bypass film of said MIS transistor is smaller than that of said gate insulation film.

3. A semiconductor apparatus according claim 1, wherein said bypass film is arranged in such a manner that a leak current in said film does not flow under a driving voltage or flows to an amount with which the operation of a circuit is not adversely affected.

4. A semiconductor apparatus according to claim 1, wherein an active region of said MIS transistor and a region of said bypass film are disposed independently.

5. A semiconductor apparatus according to claim 1, wherein a region of said bypass film is located adjacent and below a metal wiring layer and below a contact portion stacked between said gate electrode of said MIS transistor and said metal wiring layer.

6. A semiconductor apparatus according to claim 1, wherein a region of said bypass film is provided adjacent to an active region of said MIS transistor.

7. A semiconductor apparatus according to claim 1, wherein a region of said bypass film is provided within a channel of said MIS transistor.

8. A semiconductor apparatus according to claim 1, wherein a region of said bypass film is formed to traverse a part of a channel of said transistor and a high-concentration region is formed in a channel below the region of said bypass film.

9. The semiconductor apparatus according to claim 1, wherein said bypass film and said gate insulation film are formed from a single film.

10. A solid state image device having a pixel composed of one MOS transistor, comprising:

> a bypass film made of an insulation film through which a leak current is able to easily flow as compared with a gate insulation film, said bypass film being formed between a wiring portion for connecting each gate electrode of a number of MOS transistors forming a number of pixels and a drain region and being located other than within any active region.

11. The solid state imaging device according to claim 10, wherein said bypass film and said gate insulation film are formed from a single film.

12. The solid state imaging device according to claim 10, wherein said bypass film and said gate insulation film are two separate films.

13. A semiconductor apparatus comprising:

a MIS transistor, wherein:

> a gate electrode of said MIS transistor extends over a bypass film, which is located other than within any active region and made of an insulation film through which a leak current is able to easily flow as compared with a gate insulation film of said MIS transistor under the same voltage level, said gate electrode also covering the gate insulation film of said MIS transistor; and said bypass film and said gate insulation film are two separate films.

14. A semiconductor apparatus comprising:

a MIS transistor, wherein:

> a gate electrode of said MIS transistor extends over a bypass film made of an insulation film through which a leak current is able to more easily flow as compared with a gate insulation film of said MIS transistor under the same voltage level, said gate electrode also covering the gate insulation film of said MIS transistor; and
>
> a region of said bypass film is formed to traverse a part of a channel of said transistor and a high-concentration region is formed in a channel below the region of said bypass film, said high-concentration region having a higher concentration of $p^+$ ions than the remaining portion of said channel below the region of said bypass film.

* * * * *